(12) United States Patent
Hong et al.

(10) Patent No.: US 6,297,543 B1
(45) Date of Patent: Oct. 2, 2001

(54) CHIP SCALE PACKAGE

(75) Inventors: Sung Hak Hong, Kyoungki-do; Jong Tae Moon, Chollabuk-do; Chang Jun Park; Yoon Hwa Choi, both of Kyoungki-do, all of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/455,669

(22) Filed: Dec. 7, 1999

(30) Foreign Application Priority Data

Dec. 16, 1998 (KR) .................................................. 98-55240

(51) Int. Cl.[7] .................................................. H01L 23/495
(52) U.S. Cl. .................................................. 257/666; 257/676
(58) Field of Search .................................................. 257/666, 676, 257/678, 692, 690, 778

(56) References Cited

U.S. PATENT DOCUMENTS

| 5,677,566 | 10/1997 | King et al. | 257/666 |
| 5,703,407 | * 12/1997 | Hori | 257/666 |
| 6,060,768 | * 5/2000 | Hayashida et al. | 257/666 |
| 6,075,284 | * 6/2000 | Choi et al. | 257/676 |
| 6,146,918 | * 11/2000 | Lee | 257/666 |

FOREIGN PATENT DOCUMENTS

| 08116015 | 5/1996 | (JP) | H01L/23/50 |
| 08125066 | 5/1996 | (JP) | H01L/23/12 |
| 09008207 | 1/1997 | (JP) | H01L/23/50 |
| 09045818 | 2/1997 | (JP) | H01L/23/28 |
| 09246427 | 9/1997 | (JP) | H01L/23/12 |

* cited by examiner

Primary Examiner—Olik Chaudhuri
Assistant Examiner—Phat X. Cao
(74) Attorney, Agent, or Firm—Finnegan, Henderson, Farabow, Garrett & Dunner, L.L.P.

(57) ABSTRACT

The present invention discloses a chip scale package. According to this invention, a lead frame 130 is bonded with an adhesive 140 to a bottom face of a semiconductor chip 110. An inner lead 131 of the lead frame 130 is connected to a pad 111 of the semiconductor chip with a metal wire 120, and thickness of the inner lead 131 is equal to an original thickness of the lead frame 130. An outer lead 132 of the lead frame 130 is formed by partially etching a bottom face of the lead frame 130. The entire resultant is encapsulated with a molding compound 100 such that the outer lead 132 is exposed therefrom, especially there is formed a downward protruding portion 101 at the molding compound 100 in the lower inner lead portion 131. This protruding portion raises the margin controlling the bonding height during the wire-bonding process such that the metal wire 120 is not exposed from the molding compound 100. Furthermore, the outer leads 134 at both sides where no solder balls are mounted on, are exposed from the molding compound 100. The outer leads 132 at both sides being exposed from the molding compound 100 act for dissipating outwardly heat that is transmitted from the semiconductor chip 110 to the lead frame 130. A solder ball 150 is mounted at the inside of the outer lead 132 exposed from the molding compound 100.

9 Claims, 7 Drawing Sheets

CHIP SCALE PACKAGE

BACKGROUND OF THE INVENTION

1. Field of the Invention

The present invention generally relates to a chip scale package, more particularly to a chip scale package having a plurality of solder balls as external connection terminals mounted on a substrate.

2. Description of the Related Art

As for examples of package, there have been used various packages, i.e. SOJ(small outline J-lead) type for general use, ZIP (zigzag inline package) type for particular use, and TSOP (thin small outline package) type having a construction suitable for memory cards which have been standardized gradually.

Method for manufacturing those packages may be summarized as follows.

At first, a wafer is separated into individual semiconductor chips by performing a sawing process for cutting the wafer along a scribing line, and a die-attaching process is performed for attaching inner leads of lead frames to the respective semiconductor chips.

A resultant is cured thereafter, a wire-bonding process is performed for electrically connecting bonding pads of the semiconductor chips and the inner leads of the lead frames.

After the wire-bonding process, an encapsulating process for encapsulating the semiconductor chips with molding compound. By encapsulating the semiconductor chips as above, the semiconductor chips can be protected from external thermal or mechanical impacts.

After the encapsulating process as described above is completed, following are a plating process for plating outer leads; a trimming process for sawing a dam bar supporting the outer leads; and a forming process for bending the outer Leads by a selected figure so that the outer leads are easy to mount on a substrate.

In regard to the general packages as manufactured according to above steps, a chip scale package for lightening the package has a structure in which a plurality of solder balls are arranged in an array manner and the solder balls are mounted on the substrate.

FIG. 1 illustrates a package as disclosed in Japanese Patent Laid-open No. 8-125066. As disclosed, a lead frame 2 is attached to a bottom face of a semiconductor chip 1 by means of an adhesive 3, and an inner lead 21 of the lead frame 2 is electrically connected to a bonding pad of the semiconductor chip 1 and the entire resultant is encapsulated with molding compound 4 such that an outer lead 22 of the lead frame 2 is exposed from the molding compound 4. A solder ball 5 is mounted on the outer lead 22 exposed from the molding compound 4.

However, in FIG. 1, the lead frame 2 makes "]" figure, and its left end becomes the inner lead 21 and its lower right end becomes the outer lead 22. Originally the figure was not the same figure as above, the figure was formed by partially etching a cross-section of bottom portion of a rectangular. Namely, thickness of the outer lead 22 is the original thickness of the lead frame 2.

As the semiconductor chips are highly integrated and have a number of pins, the pitch between the inner leads 21 becomes fine. When the inner leads 21 are formed by partially etching with chemicals as in the conventional methods, thickness of the inner leads 21 is not uniform and etching face thereof is not even, especially corners often have curvaceous figures. If the inner leads of the lead frame have the foregoing figure, poor connection property is found during the wire-bonding process.

Further, during the wire-bonding process, it is required to adjust the metal wire 6 not being exposed below the molding compound 4. However, it is very difficult to control bonding height since etching depth of the lead frame is not always uniform. In other words, there is a problem that the height should be controlled all the time precisely.

SUMMARY OF THE INVENTION

Accordingly, the present invention is provided to solve foregoing problems caused by the conventional packages. It is one object of the present invention to make the thickness of the inner leads to be equal to the original lead frames and to minimize the partial etching area thereby preventing the poor connection property during metal wire-bonding process.

The other object of the present invention is to make the process of adjusting the bonding height a lot easier by preventing the metal wire to be exposed from the molding compound.

To accomplish those objects of the present invention, the chip scale package according to the present invention is constructed as follows.

A lead frame is attached with an adhesive to a bottom face of a semiconductor chip in which a bonding pad is formed. An inner lead of the lead frame is connected to the bonding pad of the semiconductor chip with a metal wire, and thickness of the inner lead is equal to the original thickness of the lead frame. An outer lead of the lead frame is formed by partially etching a bottom face of the lead frame. The entire resultant is encapsulated with a molding compound such that the outer lead is exposed therefrom, especially there is formed a downward protruding portion at the molding compound below the inner lead. This protruding portion raises the margin of controlling the bonding height during the wire-bonding process such that the metal wire is not exposed from the molding compound. Furthermore, the outer leads at both sides where no solder balls are mounted on, are exposed from the molding compound. The outer leads at both sides being exposed from the molding compound act for dissipating outwardly heat that is transmitted from the semiconductor chip to the lead frame. A solder ball is mounted at inside of the outer leads exposed from the molding compound.

According to he foregoing construction, transformation in the lead frame can be prevented since the inner lead is not partially etched but is maintained the original thickness of the lead frame, and instead the outer lead is partially etched. Accordingly, poor quality in the wire-bonding can be prevented.

DETAILED DESCRIPTION OF THE PREFERRED EMBODIMENTS

[First Embodiment]

Figure 2A:
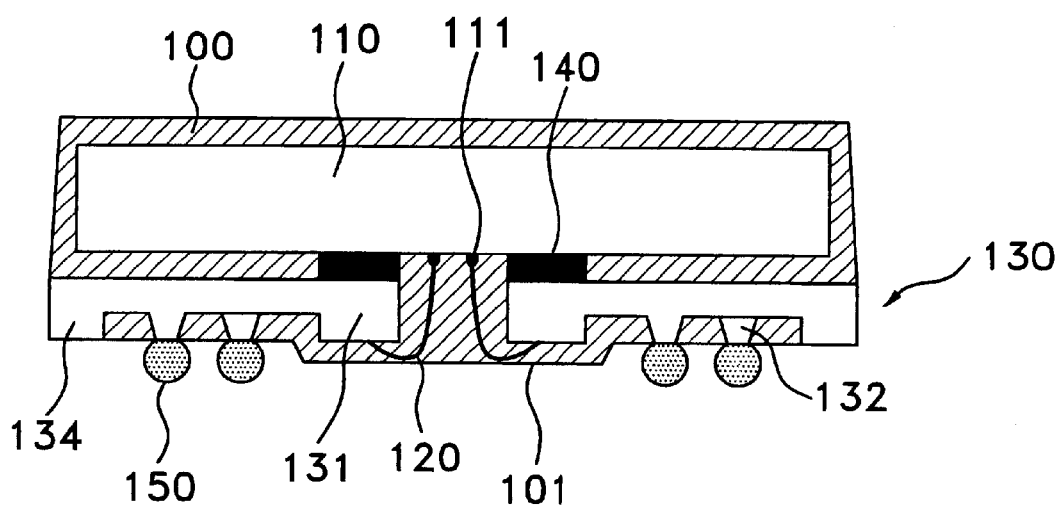
FIGS. 2A to 2B are front sectional view and partial perspective view of a package according to a first embodiment of the present invention.

As shown in FIG. 2a, a semiconductor chip 110 is disposed such that a bonding pad 111 thereof is disposed downward. A lead frame 130 made of a copper ally is attached to a bottom face of the semiconductor chip 110 by mean of an adhesive 140.

The lead frame 130 is the distinctive feature of the present invention. A cross-sectional view of the lead frame 130 has a rectangular shape whose width is relatively larger than its length. And then, in this type of lead frame, its inner end becomes an inner lead 131 and its bottom face becomes an outer lead 132.

Particularly, the inner lead 131 of the present invention has the same thickness as the original thickness of the lead frame 130. Namely, the inner lead 131 is not formed by the partial etching process, but is formed as the inner end itself of the lead frame 130. A bottom face of the inner lead 131 is electrically connected to the bonding pad 111 of the semiconductor chip 110 by means of a metal wire 120. Especially, to improve the bonding reliability, it is preferable that one or a plurality of materials selected from groups consisting of Ag/Ni/Pd or Ni/Pd/Au can be plated at the bottom of the inner lead 131.

Figure 2B:
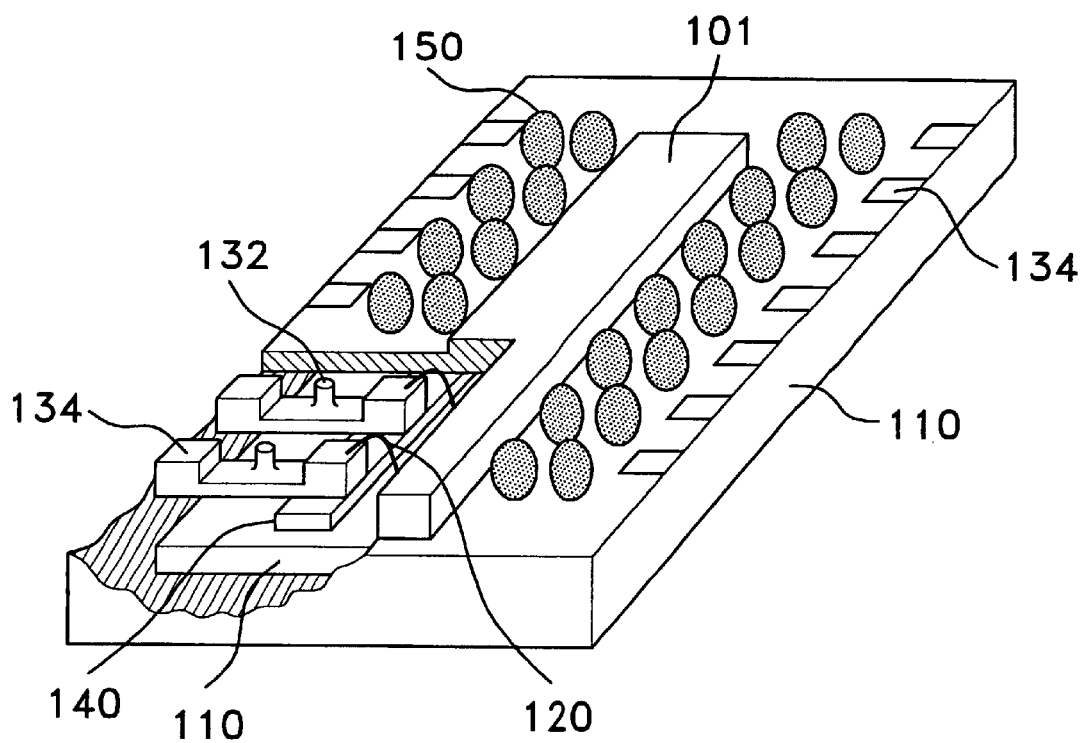
Figure 3:
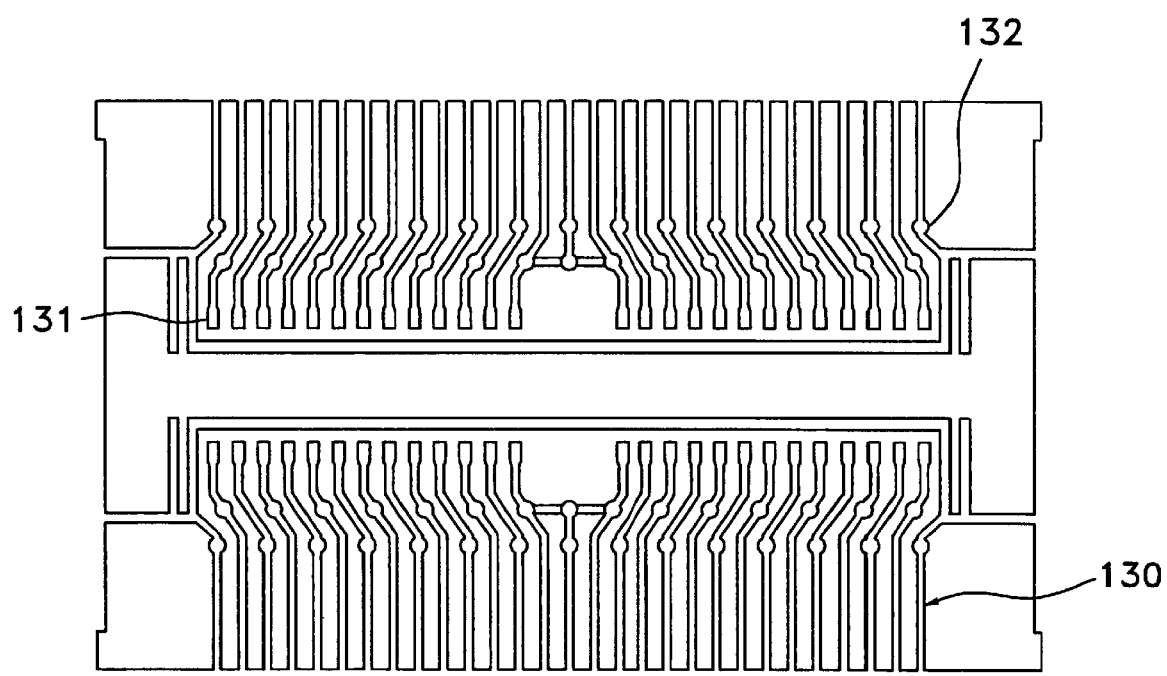
FIG. 3 is a plan view showing arrangement of the lead frames, the main parts of the present invention.

On the other hand, the outer lead 132 is formed by the partial etching process. In other words, three spots on the bottom face of the lead frame 130 are partially etched thereby forming two outer leads 132 from inside and one outer lead 134 from outside. In the meantime, the bottom face of the inner lead 131 is not etched but maintains the original thickness of the lead frame 130. Another outer leads 134 are automatically formed at both ends of the lead frame 130 as described above. Those outer leads 134 also have the same thickness as the original thickness of the lead frame 130. Solder balls 150 are mounted at those two outer leads 132 disposed at the inside while no solder balls are mounted on the leads 134 at the outside. As shown in FIG. 2B, the outer leads 132 at the inside have a cylindrical shape. FIG. 3 illustrates the arrangement of lead frames 130 having the inner and outer leads 131,132.

Before the solder balls 50 are mounted on the outer leads 132, the entire resultant is encapsulated with a molding compound 100 such that the respective outer leads 132,134 are exposed from the molding compound 100. Especially in the central bottom face of the molding compound 100, a protruding portion 101 is formed. The protruding portion 101 acts for preventing the metal wire 120 from being exposed below the molding compound 100 during a wire-bonding process. To put it concretely, during the wire-bonding process, since the metal wire 120 may droop below the bottom face of the inner lead 131, if the central bottom face of the molding compound 100 is in the same plane with the lower end of the outer lead 132, the metal wire 120 may be exposed below the molding compound 100 after the molding process. Therefore, the protruding portion 101 is formed at the molding compound 100.

Further, it is preferable that the protruding portion 101 is formed with a thickness that makes the portion 101 to be located almost in the same plane with an end of the solder ball 150, or above the end of the solder ball 150. By doing so, the protruding portion 101 is faced to a substrate since the solder ball 150 is a bit shrunken when the solder ball 150 is mounted on the substrate, and the protruding portion 101 acts to maintain a boning condition such that the package is firmly bonded to the substrate. Namely, the substrate and the package are mechanically connected to each other by the medium of the protruding portion 101 and the solder ball 150 acts only to connect therebetween electrically thereby improving the juncture reliability of the solder ball 150.

Bottom and outer side faces of the outer leads 134 disposed at both sides are exposed from the molding compound 100 as described above. The outer leads 134 exposed from the molding compound 100 have important roles also. The outer leads 134 act for dissipating outwardly heat transmitted from the lead frame 130 when the semiconductor chip 110 is driven. Namely, since the outer leads 134 having no solder ball 150 are exposed from the molding compound 100 directly to the outside, heat occurred from the semiconductor chip 110 and transmitted to the lead frame 130, is easily dissipated outwardly through the outer leads 134. Therefore, a crack caused by the stress of the heat at the lead frame 130 can be prevented.

The solder balls 150 are mounted at the inside of two outer leads 132 exposed from the molding compound 100. There are provided three modified examples to intensify the adhesion property between the solder balls 150 and the outer leads 132 in the present invention as shown in FIGS. 4A to 4C.

Figure 4A:
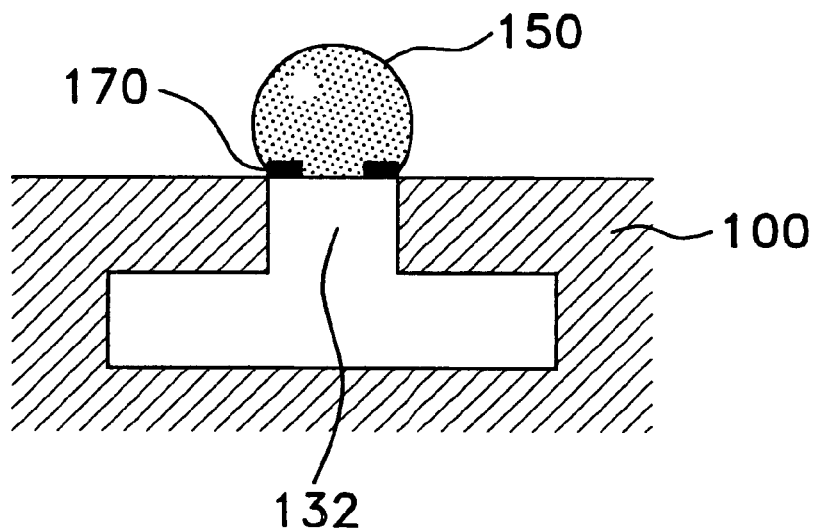
FIGS. 4A to 4C illustrate three modified examples showing the junction structure of solder ball and outer leads according to the present invention.
Figure 4B:
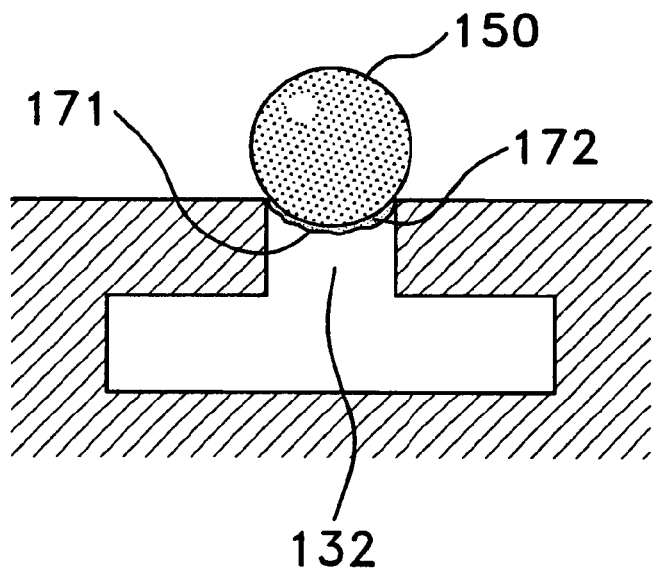
Figure 4C:
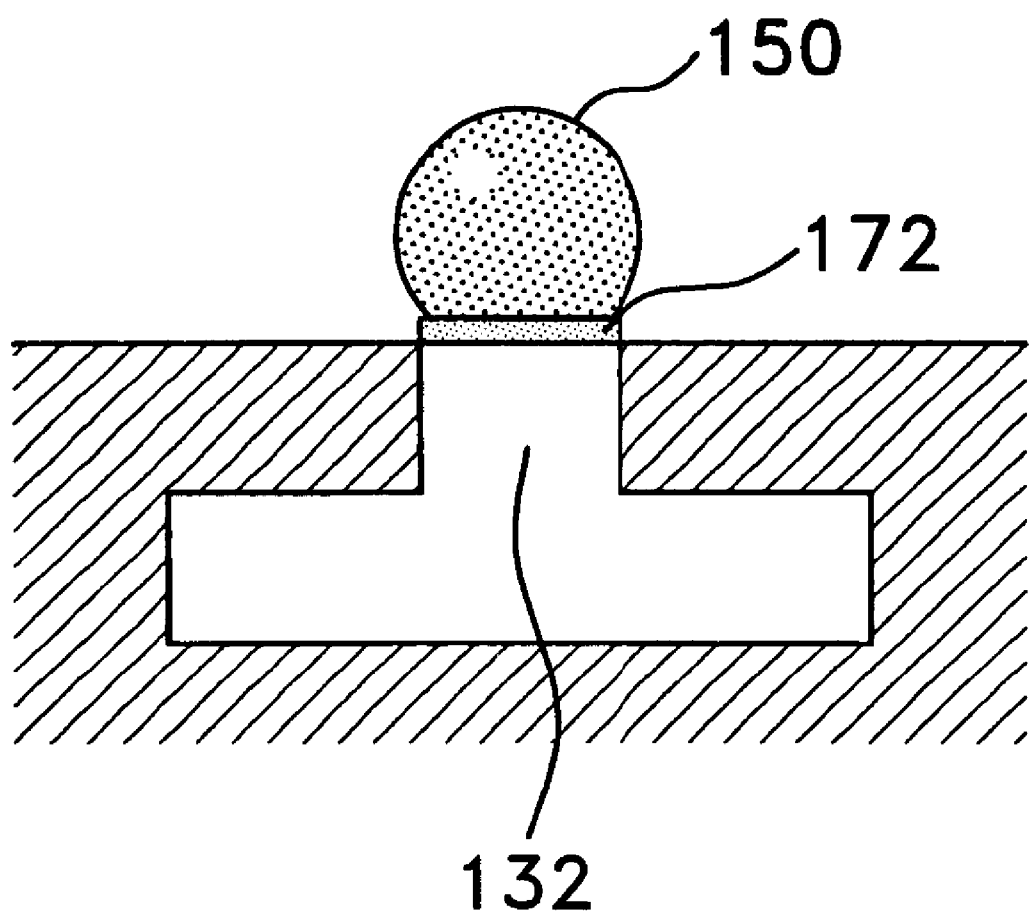

The example as shown in FIG. 4A is that a metal ring 170 is deposited on a surface of an outer lead 132, and the example shown in FIG. 4C is that a metal layer 172 not metal ring, is deposited with a selected thickness.

And, the example in FIG. 4B is that a recess 171 having a shape of a hemisphere is formed on an outer lead 132 to correspond with the shape of a solder ball 150 and a metal layer 172 is deposited on a surface of the recess 171.

The metal ring 170 or the metal layer 172 is an alloy made of Ni/Ag, Ni/Pd, Ni/Pd/Au, Pb/Sn, Cr/Ni/Ag or Co/Ni/Pd. Accordingly, the metal ring 170 or the metal layer 172 is made of one or two materials selected from the group consisting of Cu, Au, Ag, Ni, Pd, Pb, Sn, Co, Ti and Cr.

A method of producing the package as constituted above is as follows. First, a wafer is separated into individual semiconductor chips 100 by sawing the wafer. A lead frame 130 as described in the previous specification, is attached at a bottom face of the semiconductor chip 100 by means of an adhesive 140. An inner lead 131 of the lead frame 130 is electrically connected to a bonding pad 111 by a metal wire 120.

Afterward, the entire resultant is encapsulated with molding compound 100 such that the outer leads 132,134 are exposed from the molding compound 100. Continuously, a deflash process to remove a mold flash that is formed by soaking the molding compound 100 into the surface of the outer lead 132 on which the solder ball 150 is mounted. The deflash process is a step for polishing a lower part of the molding compound and for simultaneously removing the mold flash by spraying water with high pressure.

And then, the molding compound 100 is cured. By taking one among three methods as described above, the metal ring 170 or the metal layer 172 is plated on the outer lead 132 exposed from the molding compound 100. A solder ball 150 is mounted on the outer lead 132 thereby accomplishing the chip scale package.

[Second Embodiment]

Figure 1:
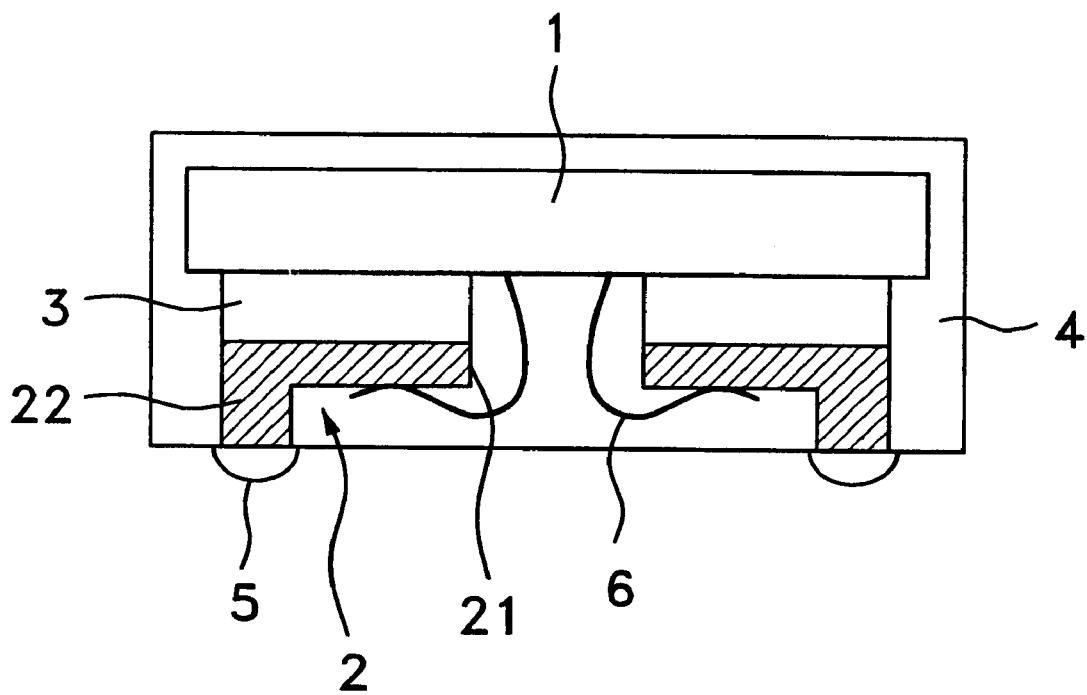
FIG. 1 is a cross-sectional view showing a convention chip scale package.
Figure 5:
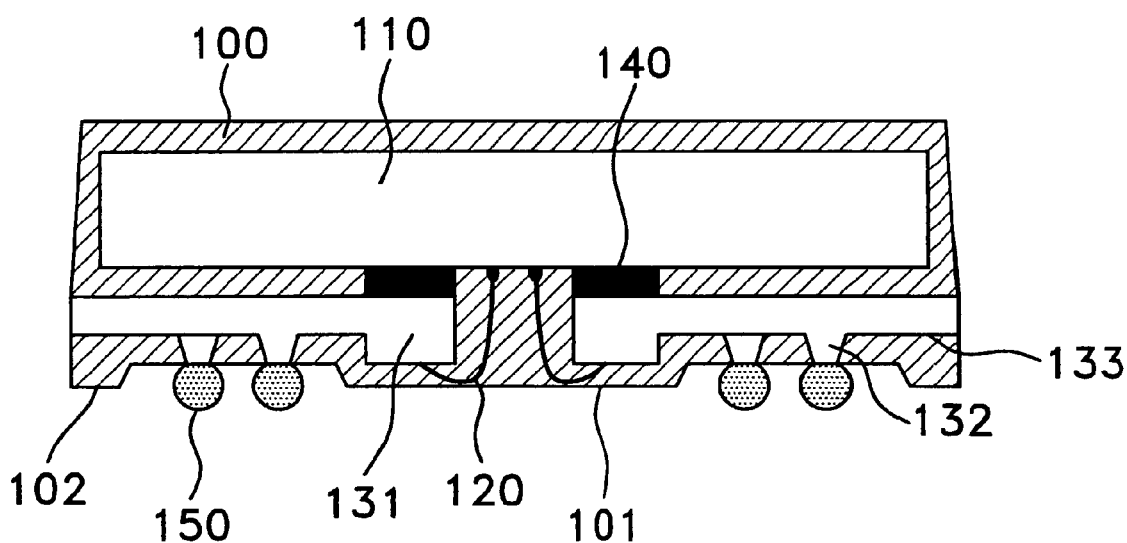
FIG. 5 is a front sectional view showing a package according to a second embodiment of the present invention.

FIG. 5 shows a package according to the second embodiment of the present invention. As shown in the drawing, there are formed protruding portions 102 not only at the central portion, but at both sides of the package. Compared to FIG. 1 as in the first embodiment, the outermost outer lead 134 is also removed by the partial etching process. The outer protruding portions 102 act for mechanically connecting the substrate and the package which was a secondary function of a central protruding portion 101.

[Third Embodiment]

Figure 6:
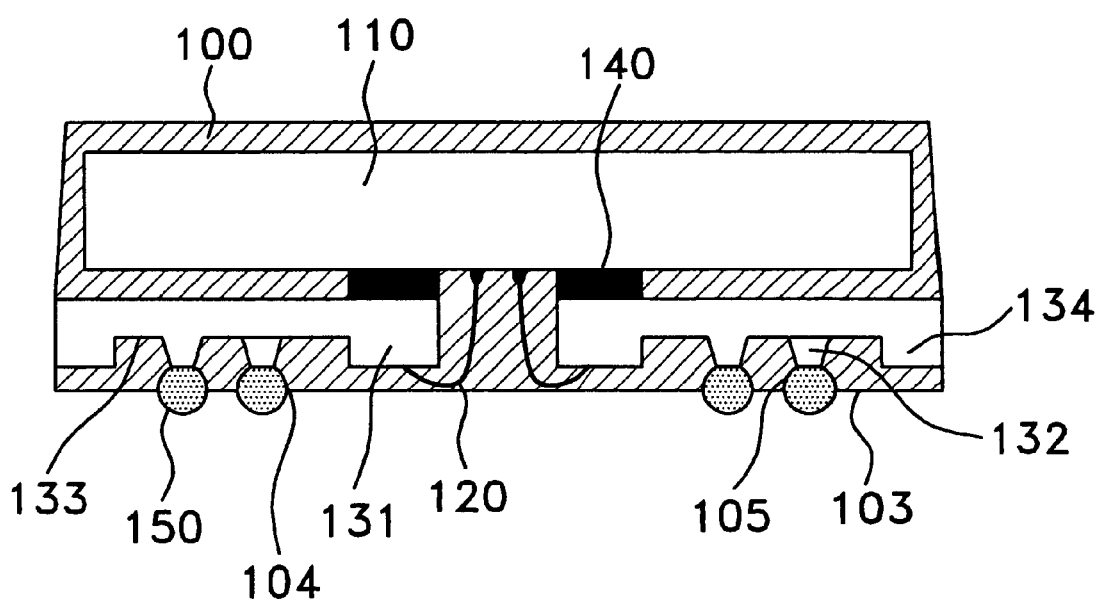
FIG. 6 is a front sectional view showing a package according to a third embodiment of the present invention.

FIG. 6 shows a package according to the third embodiment of the present invention. There are formed spaces between the solder ball 150 and both protruding portions 101,102 in the second embodiment, however no space is found in FIG. 6. This is the reason for intensifying the mechanical connection by contacting the entire bottom face of the package to the substrate.

[Fourth Embodiment]

Figure 7:
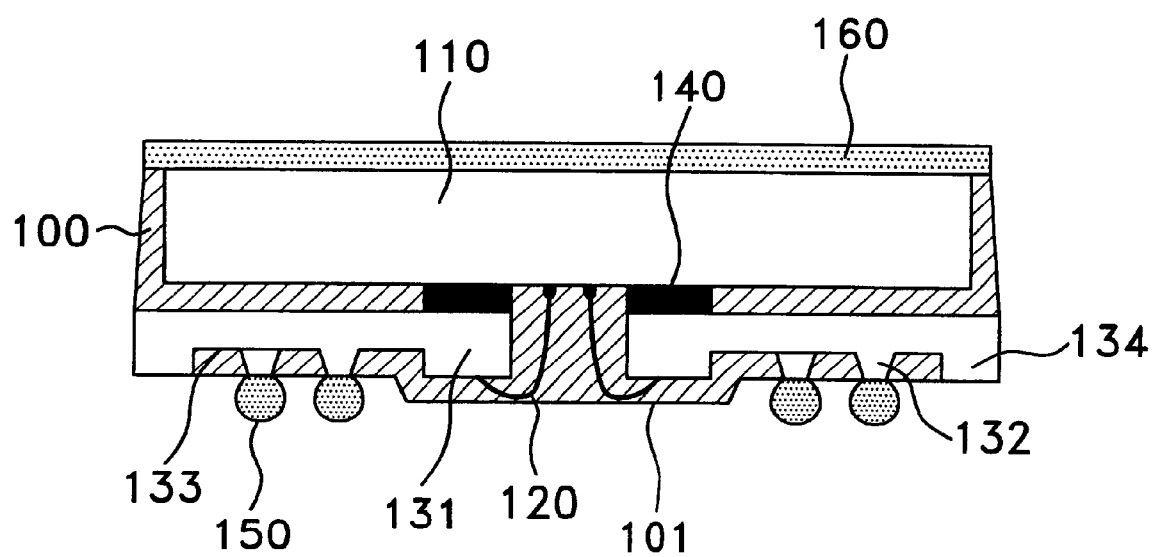
FIG. 7 is a front sectional view showing a package according to fourth embodiment of the present invention.

FIG. 7 shows a package according to the fourth embodiment of the present invention. As shown in the drawing, a surface of a semiconductor chip 100 is exposed when molding compound is encapsulated, and a heat sink 160 is attached to the surface of the semiconductor chip 110. The heat sink 160 acts for quickly dissipating outwardly heat occurred while the semiconductor chip 110 is driven.

As disclosed in the specification, according to the present invention, thickness of the inner lead is equal to the original thickness of the outer lead and the outer lead is formed by the partial etching process. Therefore, every inner lead has the same shape thereby preventing poor connection property during the wire-bonding process.

Particularly, since both sides of the lead frame are exposed from the molding compound, the heat that is transmitted from the semiconductor chip to the lead frame is dissipated easily. Accordingly, the crack caused by the stress of heat at the lead frame is controlled.

Further, there is formed a downward protruding portion at the molding compound portion below the inner lead of the lead frame thereby obtaining margin of wire-bonding process.

Although preferred embodiments of the chip scale package are described and illustrated, various other modifications will be apparent to and can be readily made by those skilled in the art without departing from the scope and spirit of the present invention.

What is claimed is:

1. A chip scale package comprising:
   a semiconductor chip disposed such that its bonding pad is disposed downward;
   a lead frame attached to a bottom face of the semiconductor chip and comprising inner and outer leads;
   a metal wire electrically connecting the inner lead of the lead frame and the bonding pad of the semiconductor chip;
   a molding compound for encapsulating an entire resultant such that the outer lead is exposed therefrom, and wherein a protruding portion for preventing the metal wire from exposing is formed below the inner lead; and
   a solder ball mounted on the outer lead exposed from the molding compound,
   wherein the outer lead of the lead frame is formed by partially etching the bottom face of the lead frame and then thickness of the inner lead becomes equal to an original thickness of the lead frame.

2. The chip scale package of claim 1, wherein the protruding portion of the molding compound is also formed at both sides of the solder ball.

3. The chip scale package of claim 1, wherein a surface of the semiconductor chip is exposed from the molding compound and a heat sink is attached to the exposed surface of the semiconductor chip.

4. The chip scale package of claim 1, wherein a recess having a shape corresponding to the shape of the solder ball is formed on a surface of the outer lead.

5. The chip scale package of claim 4, wherein a metal layer is deposited on a surface of the recess.

6. The chip scale package of claim 1, wherein a metal ring is plated on a surface of the outer lead.

7. The chip scale package of claim 1, wherein a metal layer is plated on a surface of the outer lead.

8. The chip scale package as in any of claims 5 to 7, wherein the metal layer or the metal ring is an alloy made of one or two materials selected from a group consisting of Cu, Au, Ag, Ni, Pd, Pb, Sn, Co, Ti and Cr.

9. The chip scale package of claim 1, wherein both sides portions of the lead frame which are not etched, are exposed from the molding compound so as to dissipate outwardly heat that is transmitted from the semiconductor chip to the lead frame.

* * * * *